United States Patent [19]

Yamamoto et al.

[11] Patent Number: 4,748,412
[45] Date of Patent: May 31, 1988

[54] HIGH-FREQUENCY COIL FOR NUCLEAR MAGNETIC RESONATOR

[75] Inventors: Etsuji Yamamoto, Akishima; Takashi Onodera, Koganei; Hideki Kohno, Tokyo, all of Japan

[73] Assignee: Hitachi, Ltd., Tokyo, Japan

[21] Appl. No.: 16,401

[22] Filed: Feb. 19, 1987

[30] Foreign Application Priority Data

Mar. 7, 1986 [JP]  Japan ................................. 61-48311

[51] Int. Cl.$^4$ ............................................. G01R 33/20
[52] U.S. Cl. ..................................... 324/318; 333/219
[58] Field of Search ......................... 333/219, 223, 235;
324/300, 307, 309, 320, 318, 322; 128/653; 336/178

[56] References Cited

U.S. PATENT DOCUMENTS

| | | | |
|---|---|---|---|
| 4,446,429 | 5/1984 | Froncisz | 333/219 |
| 4,594,566 | 6/1986 | Maudsley | 333/223 |
| 4,621,237 | 11/1986 | Timms | 324/318 |
| 4,641,097 | 2/1987 | Bottomley | 324/318 |
| 4,641,098 | 2/1987 | Doty | 324/322 |

Primary Examiner—Michael J. Tokar
Attorney, Agent, or Firm—Antonelli, Terry & Wands

[57] ABSTRACT

An Alderman high-frequency coil used for generating or detecting a high-frequency magnetic field in an NMR apparatus comprises two ring-shaped inner conductors aligned coaxially with a spacing being made therebetween and two outer conductors disposed to surround the inner conductors. The outer conductors are each split along the current path to form a 4-piece outer conductor.

7 Claims, 4 Drawing Sheets

HIGH-FREQUENCY COIL FOR NUCLEAR MAGNETIC RESONATOR

BACKGROUND OF THE INVENTION

This invention relates to an apparatus for measuring a nuclear magnetic resonance (NMR) signal from hydrogen, phosphorus, or the like in bion and imaging the density distribution of nuclei, distribution of relaxation time, and the like, and particularly to a coil used for generating or receiving a high-frequency magnetic field.

There have been widely used the X-ray CT and ultrasonic imaging apparatus for the nondestructive inspection of an internal structure such as of a human brain and abdomen. A recent successful attempt to conduct similar inspection using nuclear magnetic resonance phenomenon has revealed the possibility of information acquisition which could not have been accomplished by the X-ray CT or ultrasonic imaging apparatus. In the inspection apparatus using nuclear magnetic resonance phenomenon, it is necessary to identify signals from an object under test separately for each portion of the object. A known method is that a gradient magnetic field is applied to an object under test to produce a different static magnetic field at each portion of the object so that positional information is acquired from a different resonance frequency or phase encode value of each portion. The fundamental principle of this method is described in Journal of Magnetic Resonance, Vol. 18 (1975), pp. 69–83, and also Physics in Medicine & Biology, Vol. 25 (1980), pp. 751–756.

Based on the fact that the SN ratio in NMR increases in proportion to the power of about 1.5 of the static magnetic field H, an attempt is being made to improve the SN ratio by producing a high-intensity magnetic field with a superconductive magnet. Conventionally, solenoids and saddle-shaped coils have been used as a coil for NMR. In this case, the resonance frequency rises as the magnetic field intensity increases, causing the self-resonant frequency of the coil to come close to or exceed the NMR frequency, resulting in a degraded sensitivity of the receiving coil or degraded efficiency of generating a high-frequency magnetic field by the transmitting coil.

A high-frequency coil overcoming this problem is described in Journal of Magnetic Resonance, Vol. 36 (1979), pp. 447–452. The coil known by the name of Alderman and Grant coil or slotted resonator has a structure as shown in FIG. 9, in which two ring-shaped inner conductors 81 and 82 are disposed coaxially, with two-piece outer conductors having wing portions being located in close vicinity to the inner conductors. The capacitive coupling between the inner and outer conductors form a loop circuit 84-82-83-81, and by application of a high-frequency current through lead wires 85 and 86 connected to the end of the conductors 84 and 81, respectively, a high-frequency magnetic field is generated in the central section in the direction shown by the arrow 88. The structure allows the detection of the high-frequency magnetic field, i.e., an NMR signal, at the section 88. Capacitors 87 are connected between the two outer conductors 83 and 84 for adjusting the resonance frequency of the coil.

The Alderman coil has the advantage of providing a higher self-resonant frequency. On the other hand, however, unbalanced capacitive coupling between the conductors is apt to create an uneven coil current, resulting in an uneven high-frequency magnetic field at transmission and an uneven sensitivity at reception.

SUMMARY OF THE INVENTION

An object of this invention is to provide a high-frequency coil with enhanced spatial uniformity of the intensity distribution of the generated high-frequency magnetic field or the sensitivity distribution of the received high-frequency magnetic field.

Another object of this invention is to provide a high-frequency coil with less influence on the waveform of the gradient magnetic field.

Still another object of this invention is to provide a receiving high-frequency coil with less attenuation of the high-frequency magnetic field generated by the transmitting high-frequency coil.

A feature of this invention is that the outer conductors of Alderman and Grant coil are further divided laterally along the path of the high-frequency current at the position of the current supply point and the position of its symmetrical point. The divided outer conductors compel the current path to orient in one direction, thereby alleviating an uneven current derived from the unbalance of the manufactured coil, and a high-frequency coil with uniform intensity or uniform sensitivity of the high-frequency magnetic field is realized.

Another feature of this invention is that the inner conductors are also divided at the current supply point and its symmetrical point. The structure eliminates the closed loop made up solely of conductors, precluding the current created in the coil due to the variation of the gradient magnetic field produced in the NMR apparatus, whereby the response of the gradient magnetic field is improved.

Other features of this invention will become more apparent from the following description of the specific embodiments of the invention.

DESCRIPTION OF THE PREFERRED EMBODIMENTS

Embodiments of this invention will be described with reference to the drawings.

Figure 1:
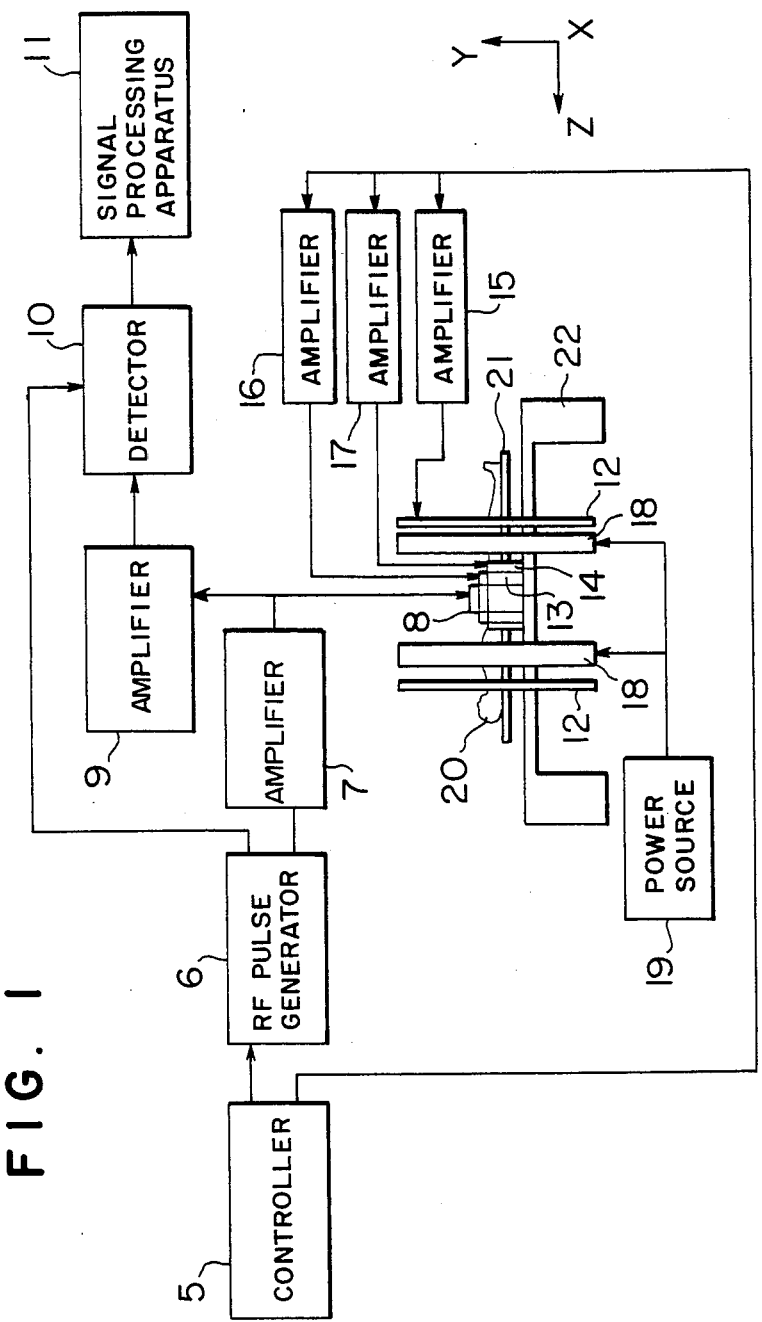
FIG. 1 is a block diagram of the NMR imaging apparatus to which the present invention is applied.

FIG. 1 shows the system configuration of the nuclear magnetic resonance apparatus embodying the present invention. In the figure, a controller 5 issues various commands to functional blocks in a certain timing relationship. A high-frequency pulse generator 6 has its output amplified by an amplifier 7, the output of which is applied to a high-frequency coil 8 so that it is excited. A signal component received by the high-frequency coil 8 is treated by an amplifier 9 and, after being detected by a detector 10, transformed into an image by a signal processing apparatus 11. Coils 12, 13 and 14 are energized by respective amplifiers 15, 16 and 17 to produce gradient magnetic fields in the Z direction and directions at right angles with it. A coil 18 energized by a power source 19 produces a static magnetic field. The coil 14 is disposed with a 90° rotation with respect to the coil 13 around the Z axis, and these coils having the same structure produces intersecting gradient magnetic fields. An inspection bed 21 on which a patient 20 lies is movable on the chassis 22.

Figure 2:
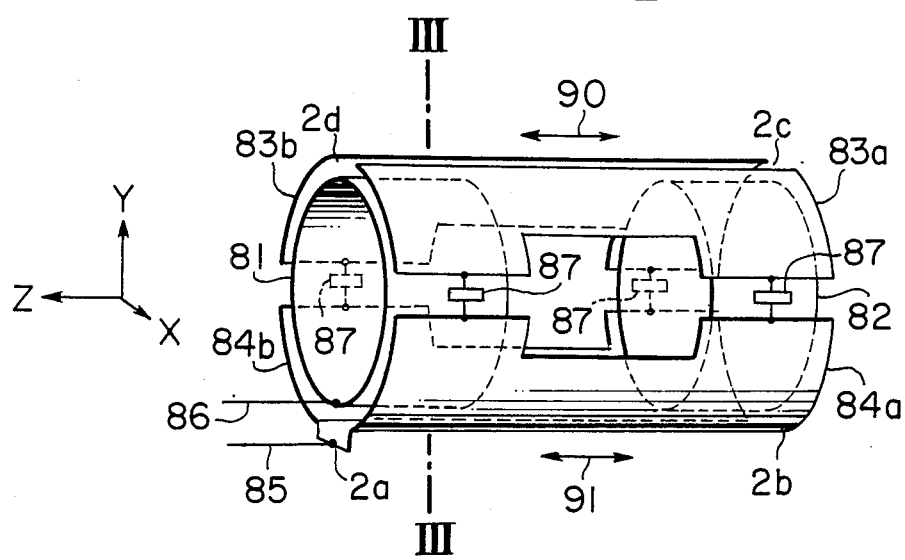
FIG. 2 is a perspective view of the high-frequency coil embodying the present invention.
Figure 9:
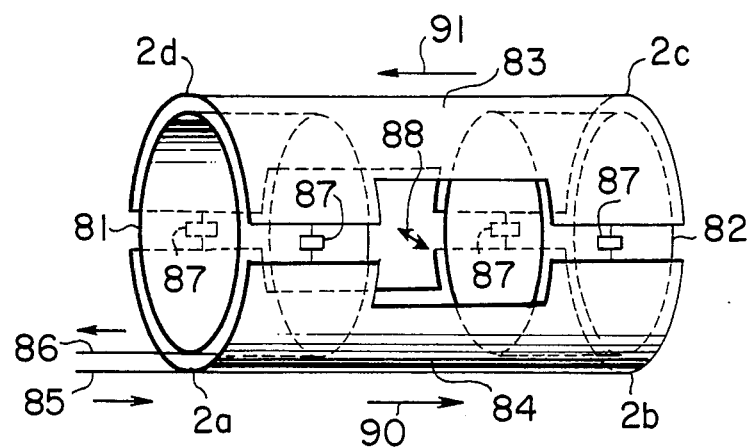
FIG. 9 is a perspective view of a conventional high-frequency coil.

FIG. 2 shows in detail the high-frequency coil 8 for generating a high-frequency magnetic field and receiving an NMR signal from the patient. The coil 8 includes two inner conductors 81 and 82 disposed coaxially and outer conductors 83a, 83b, 84a and 84b located to closely surround the inner conductors. In contrast to the conventional coil structure shown in FIG. 9, the upper and lower outer conductors having as central band portion and four wing portion at the ends thereof are each split into two sections, a total of four pieces, on the line connecting the current supply points 2a and 2b and the line connecting their symmetrical points 2d and 2c. The coil structure as a whole constitutes a loop circuit 84a and 84b-82-83a and 83b-81 by the capacitive coupling between the inner and outer conductors. The coil 8 produces a high-frequency magnetic field along the X axis in its interior space by being supplied with a high-frequency current through a lead wire 85 connected to one end of the conductors 84a and 84b and another lead wire 86 connected to one end of the conductor 81, and also receives an NMR signal from the patient lying inside the coil and sends it out through the lead wires 85 and 86.

Figure 3:
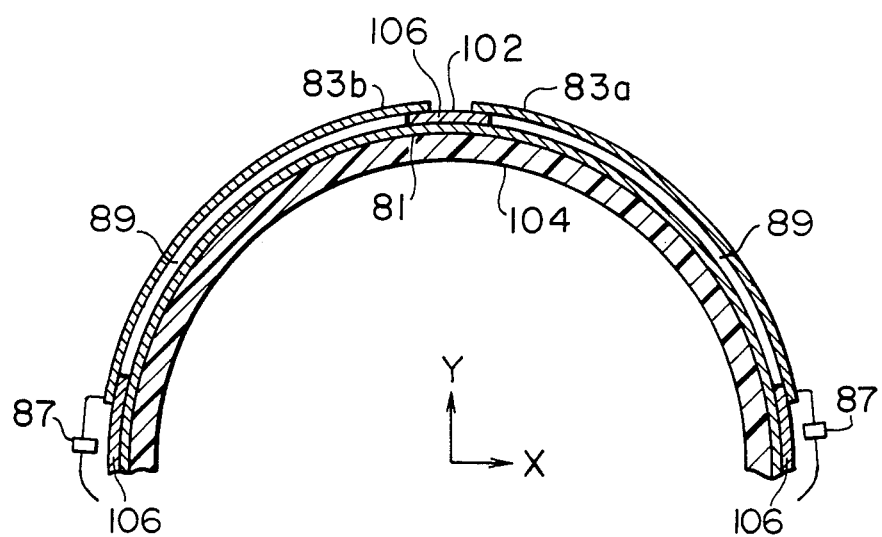
FIG. 3 is a cross-sectional view of the above embodiment.

FIG. 3 shows a partial cross section of the coil 8 cut on the X-Y plane at position III—III of FIG. 2. The inner conductor 81 is formed on the exterior surface of an insulator bobbin 104, and it is coated with an insulator, e.g., teflon, 106 in a constant thickness. Formed on the insulation layer 106 are the outer conductors 83a and 83b, and they are separated at a portion shown by 102. The portions 89 of the insulator 106 between the inner conductor 81 and the outer conductors 83a and 83b are removed to decrease the capacitance between the conductors so that the resonant frequency becomes higher. Alternatively, the conductors may be formed on the interior and exterior surfaces of the bobbin 104 which is designed to function also as the insulator 106.

In the high-frequency coil of this embodiment having outer conductors each split into two at the current supply point 2a and its symmetrical point 2d, the currents on the outer conductors are compelled to flow in the direction shown by the arrows 90 and 91 in FIG. 2, i.e., along the divisional slit of the outer conductors (Z-axis direction). On this account, a slightly unbalanced capacitive coupling does not create a current in direction different from the Z-axis direction, and therefore a significant unevenness of the current density does not result. Consequently, the generated high-frequency magnetic field is rendered uniform, and the sensitivity of detecting the high-frequency magnetic field is also uniform.

Figure 4:
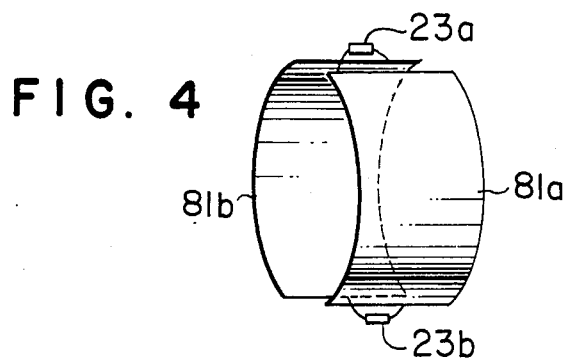
FIGS. 4, 5, 6, 7 and 8 are diagrams showing other embodiments of the present invention.

Although the embodiment of FIG. 2 employs the ring-shaped inner conductors 81 and 82, each of them may be replaced with one shown in FIG. 4. The inner conductor of FIG. 4 is split into two pieces 81a and 81b at the current supply point (point 2a in FIG. 2) and its symmetrical point. The use of the divided inner conductor can preclude the induction of a current on it caused by the gradient magnetic field which varies with time, and therefore the response of the gradient magnetic field waveform is not adversely affected. In this case, the divided inner conductor pieces 81a and 81b may be connected through capacitors 23a and 23b, so that the current distribution of the whole high-frequency coil is adjusted by choosing the value of the capacitors. These two capacitors 23a and 23b may be removed when it is not necessary to adjust the current distribution.

Figure 5:
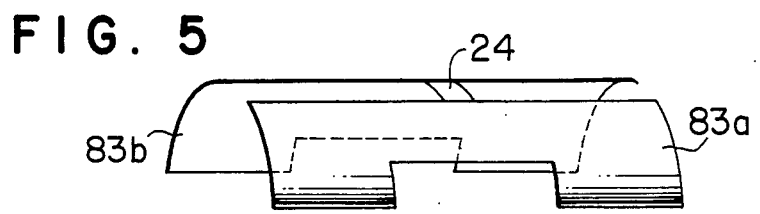

FIG. 5 shows another embodiment of this invention, in which the outer conductor is split into 83a and 83b and thereafter both members are connected through a metallic bridge 24. By sliding the metallic bridge 24 on the outer conductor, the current distribution can be adjusted. The metallic bridge may be replaced with a capacitor which functions equivalently to the metallic bridge. Although FIG. 5 shows only the upper portion of the outer conductor, the lower portion can have the same structure.

Figure 6:
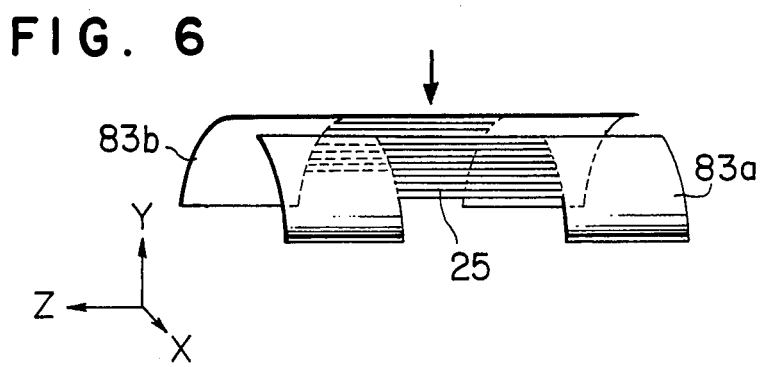

FIG. 6 shows still another embodiment of the high-frequency coil, in which, as shown for its upper portion, a mid section 25 between both ends of the metallic outer conductor piece is replaced with a plurality of metallic lines or metallic tubes aligned in the Z-axis direction (current flow direction) spaced out from one another. Also in this structure, a gap is formed between the conductor pieces 83a and 83b as in the case of FIG. 2, and more uniform current density is achieved as compared with the embodiment of FIG. 2.

Although various embodiments of the invention have been described on the premise that a single high-frequency coil is used for both generation and detection of the high-frequency magnetic field, the coil may be used exclusively for generation or detection of the high-frequency magnetic field. In this case, a dual high-frequency coil structure as shown in FIG. 7 will be formed.

Figure 7:
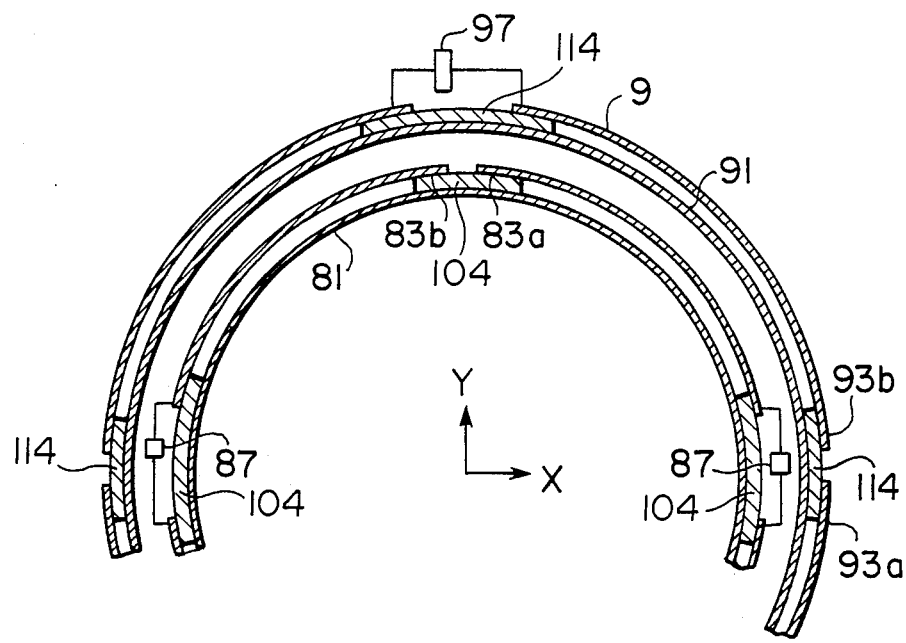

FIG. 7 shows the cross section of the dual high-frequency coil structure. An inner conductor 81 and outer conductors 83a and 83b are formed on the inner bobbin 104 to complete a high-frequency coil shown in FIG. 2, and it is used for the detection of the NMR signal. In exactly the same manner an inner conductor 91 and outer conductors 93a and 93b are formed on an outer bobbin 114 to complete another high frequency coil as shown in FIG. 2. The both bobbins are partially removed to reduce the capacitance between conductors. Symbol 97 denotes a capacitor for adjusting the resonance frequency. The outer high frequency coil produces a high-frequency magnetic field in the Y-axis direction, while the inner high-frequency coil has a maximum detection sensitivity in the X-axis direction. Namely, the structure adopts the cross coil system in which two high-frequency coils are oriented 90° apart from each other. In this case, the use of the inner high-frequency coil having the structure shown in FIG. 6 is advantageous in little attenuation of the high-frequency magnetic field produced by the outer coil.

Figure 8:
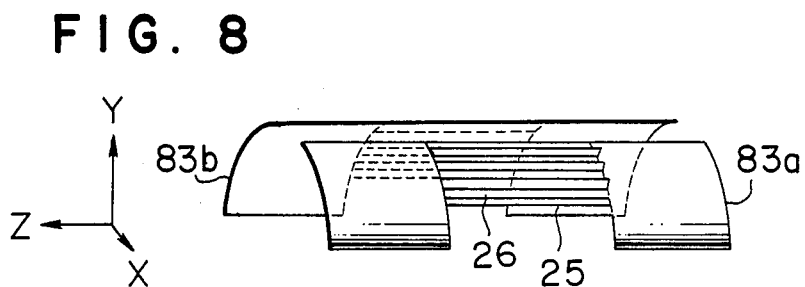

FIG. 8 shows an example of the outer conductor of the high-frequency coil which is more suitable for use as a detecting high-frequency coil disposed inside of the outer high-frequency coil for generating a high-frequency magnetic field. The outer conductor has its central section 26 structured to be an alignment of thin, fin-shaped metallic plates, and the structure alleviates the attenuation of the high-frequency magnetic field in the Y-axis direction and at the same time lowers the coil inductance.

We claim:

1. A high-frequency coil for a nuclear magnetic resonance apparatus, comprising:

first and second outer conductors formed at opposite positions in a cylindrical plane, each having a central band portion, extended parallel to a center axis of said cylindrical plane and four wing portions extended from both ends of said band portion, a selected one end of said band portion of said first and second conductors being used as a first current supply position, wherein both of said first and second outer conductors are respectively split into two pieces by lines parallel to center lines at said first current supply position and at a position symmetrical to said first current supply position, and means for respectively coupling each of the ends of said wing portions to the end of an adjacent wing portion;

first and second ring-shaped inner conductors each positioned inwardly of said wing portions, a position adjacent to the selected one end of said center band of said first and second inner conductors being used as a second current supply position;

dielectric means for insulatively separating each of said first and second inner conductors from said first and second outer conductors;

a first lead wire connected to both pieces forming one of said first and second outer conductors at said first current supply position;

a second lead wire connected to one of said first and second inner conductors at said second current supply position.

2. A high-frequency coil according to claim 1, wherein split pieces of said first and second outer conductors are short-circuited at specific sections with a metallic member or a material equivalent thereto.

3. A high-frequency coil according to claim 1, wherein a central section of said band portion is formed of a linear, tubular or strip-shaped conductor.

4. A high-frequency coil according to claim 1, wherein said dielectric means includes a bobbin of said coil.

5. A high-frequency coil according to claim 4, wherein said dielectric means is partially removed to reduce the capacitance between said outer conductors and said inner conductors.

6. A high-frequency coil according to claim 1, wherein each of said first and second inner conductors is split into two pieces by lines at said second current supply position and at a position symmetrical to said second current supply position.

7. A high-frequency coil according to claim 6, wherein said pieces forming each of said first and second inner conductors are coupled at ends of said pieces by capacitors.

* * * * *